United States Patent
Van de Ven

[19]

[11] Patent Number: 5,812,105
[45] Date of Patent: Sep. 22, 1998

[54] LED DOT MATRIX DRIVE METHOD AND APPARATUS

[75] Inventor: Antony Paul Van de Ven, Morrisville, N.C.

[73] Assignee: Cree Research, Inc., Durham, N.C.

[21] Appl. No.: 658,440

[22] Filed: Jun. 10, 1996

[51] Int. Cl.$^6$ .................................................. G09G 3/32
[52] U.S. Cl. ............................ 345/83; 345/82; 345/46
[58] Field of Search .................. 345/82, 83, 39, 345/46

[56] References Cited

U.S. PATENT DOCUMENTS

| | | | |
|---|---|---|---|
| 3,776,615 | 12/1973 | Tsukamoto et al. | 345/87 |
| 4,180,813 | 12/1979 | Yoneda | 345/100 |
| 4,368,963 | 1/1983 | Stolov | 353/31 |
| 4,410,887 | 10/1983 | Stolov et al. | 345/50 |
| 4,581,608 | 4/1986 | Aftergut et al. | 345/88 |
| 4,712,878 | 12/1987 | Taniguchi et al. | 349/31 |
| 4,716,403 | 12/1987 | Morozumi | 345/88 |
| 4,772,886 | 9/1988 | Hasegawa | 340/825.82 |
| 4,799,050 | 1/1989 | Prince et al. | 345/32 |
| 4,812,744 | 3/1989 | Havel | 345/39 |
| 4,868,496 | 9/1989 | Havel | 345/39 |
| 4,870,434 | 9/1989 | Sonehara | 347/139 |
| 4,907,862 | 3/1990 | Suntola | 345/88 |
| 4,918,497 | 4/1990 | Edmond | 257/77 |
| 4,978,952 | 12/1990 | Irwin | 345/102 |
| 4,992,704 | 2/1991 | Stinson | 315/312 |
| 5,027,168 | 6/1991 | Edmond | 257/103 |
| 5,063,421 | 11/1991 | Suzuki et al. | 257/77 |
| 5,093,652 | 3/1992 | Bull et al. | 345/88 |
| 5,103,328 | 4/1992 | Numao | 345/4 |
| 5,134,387 | 7/1992 | Smith et al. | 345/83 |
| 5,184,114 | 2/1993 | Brown | 345/83 |
| 5,187,547 | 2/1993 | Niina et al. | 257/77 |
| 5,243,204 | 9/1993 | Suzuki et al. | 257/77 |
| 5,247,533 | 9/1993 | Okazaki et al. | 372/45 |
| 5,273,933 | 12/1993 | Hatano et al. | 437/127 |
| 5,278,542 | 1/1994 | Smith et al. | 345/83 |
| 5,290,393 | 3/1994 | Nakamura | 437/127 |
| 5,300,788 | 4/1994 | Fan et al. | 257/13 |
| 5,302,839 | 4/1994 | Kaise et al. | 257/101 |
| 5,306,662 | 4/1994 | Nakamura et al. | 257/201 |
| 5,307,359 | 4/1994 | Sarraf | 372/21 |
| 5,324,962 | 6/1994 | Komoto et al. | 257/89 |
| 5,359,345 | 10/1994 | Hunter | 345/102 |
| 5,393,993 | 2/1995 | Edmond et al. | 257/77 |
| 5,424,560 | 6/1995 | Norman et al. | 257/40 |
| 5,450,301 | 9/1995 | Waltz et al. | 345/83 |
| 5,453,405 | 9/1995 | Fan et al. | 437/228 |

FOREIGN PATENT DOCUMENTS

| | | |
|---|---|---|
| 0303741A1 | 8/1987 | European Pat. Off. . |
| 0559124A1 | 3/1993 | European Pat. Off. . |
| 3837313A1 | 11/1988 | Germany . |
| 05125028 | 4/1993 | Japan . |
| 2176042 | 5/1986 | United Kingdom . |

OTHER PUBLICATIONS

Koga, et al., RGB Multi–Color LED Dot–Matrix Units and Their Application to Large–Size Flat Displays, *Optoelectronics Devices and Technologies*, V. 7, No. 2, pp. 221–229 (1 Dec. 1992).

Blue LED Produces 500–uW output, *Solid State Technology*, V. 38, No. 8, p. 30 (Aug. 1995).

(List continued on next page.)

*Primary Examiner*—Richard A. Hjerpe
*Assistant Examiner*—Ricardo Osorio
*Attorney, Agent, or Firm*—Myers Bigel Sibley & Sajovec; Philip Summa, Esq.

[57] ABSTRACT

A method and apparatus for driving a light emitting diode (LED) display having a matrix of LEDs of different colors wherein different color LEDs of the matrix are commonly connected so that a voltage applied to one LED of the commonly connected LEDs is applied to all of the commonly connected LEDs. Different voltages are applied to the commonly connected different color LEDs in the matrix of LEDs. A drive circuit may have commonly connected drivers which multiplex voltages to an array of commonly connected LEDs such that different voltages may be applied to LEDs having different operating voltages. An LED display is also provided.

8 Claims, 6 Drawing Sheets

OTHER PUBLICATIONS

Nakamura, et al., Superbright Green InGaN Single–Quantum–Well–Structure Light–Emitting Diodes, *Japanese Journal of Applied Physics, Part 2,* V. 34, No. 10B (ISSN 0021–4922), pp. L1332–L1335 (15 Oct. 1995).

International Search Report for International Application No. PCT/US96/20200.

Perfecting The Picture, C. M. Apt, IEEE Spectrum, Jul. 1985, pp. 60–66.

InGaN/AlGaN Double–Heterostructure Blue LEDs, S. Nakamura, Nichia Chemical Industries, Ltd., undated (6 pages).

Candela–Class High–Brightness InGaN/AlGaN Double––Heterostructure Blue–Light–Emitting Diodes, S. Nakamura et al.; Appl. Phys. Lett. 64 (13), Mar., 1994, pp. 1687–1689.

Light–Emitting Diodes Made From Silicon Carbide Bombarded With Fast Electrons, Y. A. Vodakov et al., Sov. Phys. Semicond. 26 (11), Nov. 1992, pp. 1041–1043.

Three–Color Blue–Green–Red Display Made From One Single Crystal, V. A. Dmitriev et al., Sov. Tech. Phys. Lett. 12(5), May 1988, p. 221.

Efficient Green–Emitting Silicon Carbide Diodes, Y. A. Vodakov et al., Sov. Phys. Semicond. 26 (1), Jan. 1992, pp. 59–61.

*Display Electronics,* K. Tracton, (First Edition Jan. 1979), 1977, pp. 114–115.

*Toshiba LED Dot Matrix Modules Designer's Manual* (undated).

*Technical Literature for LED Dot Matrix Unit,* Model No. LT1550ED, Sharp Corporation Electronic Components Group, Jun. 1994.

LED DOT MATRIX DRIVE METHOD AND APPARATUS

FIELD OF THE INVENTION

The present invention relates to electronic displays, and in particular relates to electronic displays in which the individual elements are light emitting diodes.

BACKGROUND OF THE INVENTION

Electronic displays are those electronic components that can convert electrical signals into visual images in real time that are otherwise suitable for direct interpretation—i.e. viewing—by a person. Such displays typically serve as the visual interface between persons and electronic devices such as computers, televisions, various forms of machinery, and numerous other applications.

The use of electronic displays has grown rapidly in recent years driven to some extent by the personal computer revolution, but also by other utilitarian and industrial applications in which such electronic displays have begun to partially or completely replace traditional methods of presenting information such as mechanical gauges, and printed paper.

One of the most familiar types of electronic display is the conventional television in which a cathode ray tube (CRT) produces the image. The nature and operation of cathode ray tubes has been well understood for several decades and will not be otherwise discussed in detail herein, except to highlight the recognition that the nature of a CRT's operation requires it to occupy a three-dimensional area that generally is directly proportional to the size of the CRT's display surface. Thus, in the conventional television set or personal computer, the CRT display tends to have a depth that is the same as, or in some cases greater than, the width and height of its display screen.

Accordingly, the desirability for an electronic display that can use space more efficiently has been well recognized for some time, and has driven the development of a number of various devices that are often referred to collectively as "flat-panel displays." A number of techniques have been attempted, and some are relatively well developed, for flat-panel displays. These include gas discharge, plasma displays, electroluminescence, light emitting diodes (LEDS), cathodoluminescence, and liquid crystal displays (LCDs). To date, flat panel technologies have been generally widely used in certain portable displays and in numerical displays that use fewer (i.e. less than several hundred) characters. For example, the typical display on a hand-held calculator can be characterized as a flat-panel display even though it tends to operate in only one color, typically using either LEDs or LCDs.

Light emitting diodes have generally been recognized as likely candidate devices for flat panel displays for a number of reasons. These include their solid state operation, the ability to make them in relatively small sizes (thus potentially increasing resolution), and potentially a relatively low cost of manufacture. To date, however, flat panel displays incorporating LEDs have failed to reach their theoretical potential in the actual marketplace.

LED flat panel displays have lacked success in penetrating the technology and the marketplace for several reasons. One basic reason is the lack of suitable or commercial acceptable LEDs in the three primary colors (red, green and blue), that can be combined to form appropriate true color flat panel images. In that regard, color can be defined for certain purposes as "that aspect of visual sensation enabling a human observer to distinguish differences between two structure-free fields of light having the same size, shape and duration." *McGraw-Hill Encyclopedia of Science and Technology,* 7th Edition, Volume 4, p. 150 (1992). Stated differently, color can be formed and perceived by the propagation of electromagnetic radiation in that portion of the electromagnetic spectrum that is generally referred to as "visible." Typically, if the electromagnetic spectrum is considered to cover wavelengths from the long electrical oscillations (e.g. $10^{14}$ micrometers) to cosmic rays ($10^{-9}$ micrometers), the visible portion of the spectrum is considered to fall from about 0.770 micrometers (770 nanometers "nm") to about 0.390 micrometers (390 nm). Accordingly, to emit visible light of even a single color, a light emitting diode must produce radiation with a wavelength of between about 390 and 770 nm. In that regard, the theory and operation of light emitting diodes and related photonic devices in general are set forth in appropriate fashion in Sze, *Physics of Semiconductor Devices,* Second Edition, pp. 681–838 (1981) and will not otherwise be discussed in great detail herein, other than as necessary to describe the invention. A similar but more condensed discussion can be found in Dorf, *The Electrical Engineering Handbook,* pp. 1763–1772 (CRC Press 1983).

Figure 6:
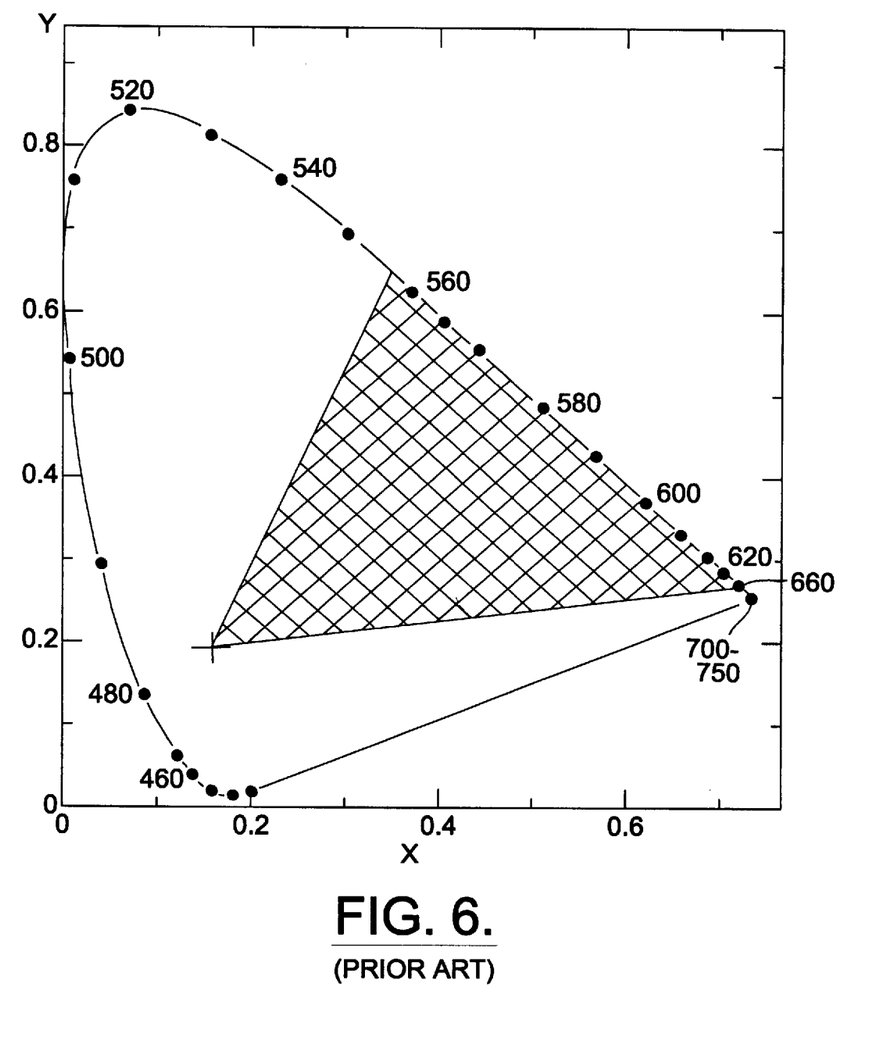
FIG. 6 is a CIE curve illustrating a portion of those visible colors typically produced by prior art multicolor devices.

In order for a display of light emitting diodes to form combinations of colors, those diodes must emit primary colors that can be mixed to form other desired colors. A typical method for describing color is the well-recognized "CIE chromaticity diagram" which was developed several decades ago by the International Commission on Illumination (CIE), and a copy of which is reproduced herein as FIG. 6. The CIE chromaticity diagram shows the relationship among colors independent of brightness. Generally speaking, the colors visible to the human eye fall on the CIE chart within an area defined by a boundary. As FIG. 6 shows, the boundary is made up of a straight line between 380 and 660 nm, and a curved line which forms the remainder of the generally cone-shaped area.

Although the color perceptions of individual persons may of course differ, it is generally well understood and expected that colors visible by most persons fall within the boundaries of the CIE diagram.

Accordingly, the color output of electronic displays, including flat panel displays, can be plotted on the CIE diagram. More particularly, if the wavelengths of the red, green, and blue primary elements of the display are plotted on the CIE diagram, the color combinations that the device can produce are represented by the triangular area taken between the primary wavelengths produced. Thus, in FIG. 6, the best available devices are plotted as the lines between the wavelengths of about 655 or 660 nanometers for aluminum gallium arsenide (AlGaAs) red devices, about 560 nanometers for gallium phosphide green devices, and about 480 nanometers for silicon carbide (SiC) blue devices. Gallium phosphide can also be used in red-emitted devices, but these generally emit in the 700 nm range. Because the human eye is less responsive at 700 nm, the devices tend to lack brightness and thus are often limited to applications where maximum brightness is less critical. Similarly, silicon carbide blue devices have only been commercially available for approximately a decade. As the triangle formed by joining these wavelengths on the CIE diagram demonstrates, there exist entire ranges of colors in both the upper and lower portions of the CIE diagram that even these most recently available displays simply cannot produce by the limitations of the physics of their LEDs.

Stated somewhat more simply, although certain LED displays can be described as "full color," they cannot be classified as "true color" unless and until they incorporate LEDs that are respectively more green, more red, and more blue, and that are formed from devices that can have sufficient brightness to make the devices worthwhile. For simplicity's sake, however, the terms "full color" and "true color" are used synonymously hereinafter.

In regard to color and brightness, and as set forth in the reference materials mentioned above, the characteristics of an LED depend primarily on the material from which it is made, including its characteristic as either a direct or indirect emitter. First, as noted above and as generally familiar to those in the electronic arts, because blue light is among the shortest wavelengths of the visible spectrum, it represents the highest energy photon as among the three primary colors. In turn, blue light can only be produced by materials with a bandgap sufficiently wide to permit a transition in electron volts that corresponds to such a higher energy shorter wavelength photon. Such materials are generally limited to silicon carbide, gallium nitride, certain other Group III nitrides, and diamond. For a number of reasons, all of these materials have been historically difficult to work with, generally because of their physical properties, their crystallography, and the difficulty in forming them into both bulk crystals and epitaxial layers, both of which are generally (although not exclusively) structural requirements for light emitting diodes.

As noted above, some SiC blue LEDs—i.e. those in which SiC forms the active layer—have become available in commercially meaningful quantities in recent years. Nevertheless, the photon emitted by SiC results from an "indirect" transition rather than a "direct" one (see Sze supra, § 12.2.1 at pages 684–686). The net effect is that SiC LEDs are limited in brightness. Thus, although their recent availability represents a technological and commercial breakthrough, their limited brightness likewise limits some of their applicability to displays, particularly larger displays that are most desirably used in bright conditions; e.g. outdoor displays used in daylight.

Accordingly, more recent work has focused on Group III (Al, In, Ga) nitrides, which have bandgaps sufficient to produce blue light, and which are direct emitters and thus offer even greater brightness potential. Group III nitrides present their own set of problems and challenges. Nevertheless, recent advances have placed Group III nitride devices into the commercial realm, and a number of these are set forth in related patents and copending applications including U.S. Pat. No. 5,393,993 and Ser. No. 08/309,251 filed Sep. 20, 1994 for "Vertical Geometry Light Emitting Diode With Group II Nitride Active Layer and Extended Lifetime"; Ser. No. 08/309,247 filed Sep. 20, 1994 for "Low Strain Laser Structure With Group III Nitride Active Layers"; and Ser. No. 08/436,141 filed May 8, 1995 for "Double Heterojunction Light Emitting Diode With Gallium Nitride Active Layer", the contents of each of which are incorporated entirely herein by reference.

As another disadvantage, flat panel displays in the current art are generally only "flat" in comparison to CRTs, and in reality have some substantial thickness. For example, a typical "flat" LED display is made up of a plurality of LED lamps. As used herein, the term "lamp" refers to one or more light emitting diodes encased in some optical medium such as a transparent polymer, and with an appropriate size and shape to enhance the perceived output of the LED. In turn, the lamps must be connected to various driving circuits, typically a multiplexing circuit that drives rows and columns in a two-dimensional matrix of such devices. These in turn require appropriate power supplies and related circuitry. The net result are devices that—although thin compared to CRTs—do have significant physical depth.

For example, LED flat panel displays of any size are typically always several inches in depth and few if any are produced that are less than an inch in depth in actual use. Indeed, some of the largest flat panel displays with which the public might be familiar (i.e. stadium scoreboards and the like) use either enough LEDs or incandescent lamps to require significant heat transfer capabilities. For example, a stadium-size flat display is typically backed by an atmospherically controlled space; i.e. an air conditioned room; to take care of the heat that is generated.

The problems of heat generated by the present LED displays is caused, in part, by the differing operating voltages of the various LEDs utilized to create the red, green and blue elements. For example, in the case of a blue LED formed of gallium nitride, the forward voltage drop across the LED is 7 volts at 70 mA current. However, for a typical green LED at 70 mA current the voltage drop is only 2.8 volts and 2.1 volts for a red LED at 70 mA current. This difference in forward voltage drops has previously present difficulties in driving the LEDs of a true color LED system.

The result of the disparate voltage drops between the red green and blue LEDs is excess heat generation as the differences in voltage are dissipated external to the LEDs. While the excess heat can be dealt with in larger displays of for example 0.3 inch (7.6 mm) pitch or greater by surface dissipation or forced air cooling, as the size of the display is reduced the problem of how to dissipate the excess heat is increased. Despite the decrease in size, the heat generated remains the same but there is less and less surface area to heat dissipation.

The excess heat resulting from the varying forward voltage drops across the LEDs reduces the life of the LEDs and, therefore, over time reduces the LEDs brightness. The brightness of the LEDs is higher at lower operating temperatures. Thus, less heat allows for lower operating currents for the same operational brightness which in turn produces less excess heat. This reduction in current may also improve the color of the LEDs. For example, green LEDs color is improves at lower operating currents. Furthermore, each of the LEDs respond differently as their operating temperatures increase and, therefore, the color characteristics of the display can change over a temperature range. Because of the varying thermal characteristics of the components of a true color display, excess heat can cause stress within the components which can cause mechanical failures including failures in the component connections. In fact, if the heat becomes too excessive it can even deform the plastic components.

Accordingly, the need exists and remains for a system of driving true color displays formed of light emitting diodes that can produce a full range of colors rather than simply multiple colors which reduces the amount of heat generated by the display, improves the color of the display, reduces the amount of power used by the display, increases the brightness of the display and provides longer component life for the display.

SUMMARY OF THE INVENTION

Accordingly, it is an object of the present invention to provide a system of driving true color displays formed of light emitting diodes which reduces the amount of heat generated by those displays. It is a further object of the present invention to provide a system of driving a true color display which improves the color and brightness of the display. It is a further object of the present invention to provide a drive system which reduces the amount of power required to drive a true color display. It is yet a further object of the present invention to provide a drive system which increases the component lifetime of a true color display.

The invention meets these and other objects by providing a method of driving a light emitting diode (LED) display having a matrix of LEDs of different colors wherein different color LEDs of the matrix are commonly connected so that a voltage applied to one LED of the commonly connected LEDs is applied to all of the commonly connected LEDs. The method provides different voltages to the commonly connected different color LEDs in the matrix of LEDs. In a certain embodiment of the present invention, the method provides a first voltage to a first selected group of LEDs of the LED matrix and a second voltage to a second selected group of LEDs of the LED matrix.

In another embodiment of the present invention, the voltages are provided sequentially such that the first voltage and the second voltage are multiplexed to the commonly connected LEDs.

In an additional embodiment of the present invention, the matrix of LEDs comprises a plurality of rows of LEDs of different colors which are commonly connected such that a voltage is applied to each LED in a row of LEDs. For such a matrix of LEDs, the different voltages may be multiplexed to a row of LEDs so as to provide different voltages to the LEDs of the row of LEDs.

In yet another embodiment of the present invention, LEDs from the first selected group of LEDs are selectively activated when the first voltage is provided to the commonly connected LEDs. LEDs from the second selected group of LEDs are selectively activated when the second voltage is provided to the commonly connected LEDs.

In an additional aspect of the present invention, a light emitting diode matrix display is provided. This light emitting diode matrix display includes a light emitting diode (LED) display having a matrix of LEDs of different colors wherein different color LEDs of the matrix are commonly connected so that a voltage applied to one LED of the commonly connected LEDs is applied to all of the commonly connected LEDs. Drivers provide different voltages to different color LEDs in the matrix of LEDs. In the light emitting diode matrix display where the matrix of LEDs comprises a plurality of rows of LEDs which are commonly connected such that a voltage is applied to each LED in a row of LEDs, the driver means may include means for multiplexing the different voltages to the row of LEDs so as to provide different voltages to the LEDs of the row of LEDs.

In an embodiment of the present invention providing a light emitting diode matrix display including a first selected group of LEDs and a second selected group of LEDs the first voltage is provided to the first selected group of LEDs in the matrix of LEDs and the second voltage is provided to the second selected group of LEDs in the matrix of LEDs. This embodiment may further include multiplexing means for sequentially providing the first voltage and the second voltage to the row of LEDs such that the first voltage and the second voltage are multiplexed to the row of LEDs. The light emitting diode matrix display may further include means for selectively activating the first group of LEDs when the first voltage is provided to the LEDs and for selectively activating the second selected group of LEDs of when the second voltage is provided to the row of LEDs.

In still another embodiment of the present invention, a circuit for driving a light emitting diode display having a matrix of light emitting diodes wherein the diodes are divided into at least one row having at least one diode operating with a first voltage and at least one diode operating with a second voltage is provided. The circuit includes a first driver connected to the light emitting diodes in said row applies the first voltage to the light emitting diodes when the first driver is active. A second driver connected to the light emitting diodes in the row applies the second voltage to the light emitting diodes when the second driver is active. Voltage selection means connected to the first driver and the second driver selectively activate the first driver to provide the first voltage to the row of diodes and selectively activates the second driver to provide the second voltage to the row of diodes. Light emitting diode selection means connected to the diodes in the row selectively activate the diodes when a voltage is applied to the diodes.

In a further embodiment of the present invention, the drive circuit includes means for selectively activating the diodes operating with a first voltage when the voltage selection means activates the first driver and for selectively activating the diodes operating with a second voltage when the voltage selection means activates the second driver.

In a further embodiment of the present invention, the drive circuit includes multiplexing means for sequentially causing the voltage selection means to provide the first voltage and the second voltage to the diodes in the row.

In another embodiment of the present invention, the drive circuit includes a first shift register corresponding to the first driver and a second shift register corresponding to the second driver. The first shift register has a bit corresponding to each of the diodes in a row operating on the first voltage and the second shift register has a bit corresponding to each of the diodes in a row operating at the second voltage. The diodes are activated by sequentially loading a bit pattern corresponding to the selected diodes to the appropriate shift register. In such a circuit it is desirable that output of the first shift register is enabled when the output of the second shift register is disabled and the output of the second shift register is enabled when the output of the first shift register is disabled. The voltage selection means may select the first voltage when the first shift register is enabled and select the second voltage when the second shift register is enabled.

In another embodiment of the present invention, the light emitting diode matrix comprises a plurality of rows. Each of the rows has a corresponding first driver for providing a first voltage to the row and a corresponding second driver for providing a second voltage to the row.

Yet another embodiment of the present invention provides a drive circuit having scanning means for sequentially causing, for each row of a plurality of rows, the voltage selection means to activate the first driver to provide the first voltage to a row and to activate the second driver to provide the second voltage to the row.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments and wherein:

DETAILED DESCRIPTION OF THE PREFERRED EMBODIMENTS

The present invention is a thin flat panel display module that can produce a full range of true colors. As set forth above, the term true color refers to a much greater range of colors than have been previously available from prior devices incorporating either light emitting diode or other technologies. Such thin flat panel display modules are also described in copending and commonly assigned U.S. patent application Ser. No. 08/580,771, entitled "TRUE COLOR FLAT PANEL DISPLAY MODULE" and filed Dec. 29, 1995, the disclosure of which is incorporated herein by reference as if set forth fully.

The invention provides a thin flat panel display module suitable as a subassembly for construction of any size, although predominantly wall sized, thin flat panel displays. The modules of the invention are capable of displaying portions of any visual image, either moving or stationary, in either any color or combination of colors. By combining modules horizontally and vertically, virtually any size of display board can be constructed.

Figure 1:
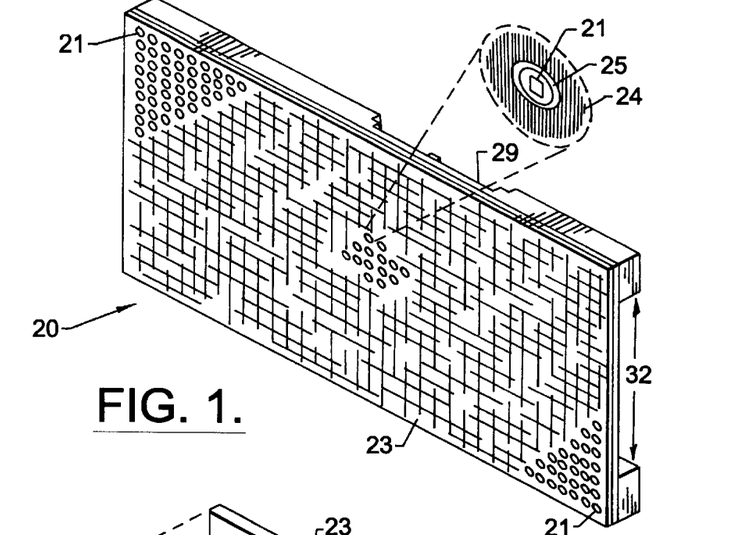
FIG. 1 is a perspective view of a module according to the present invention.
Figure 2:
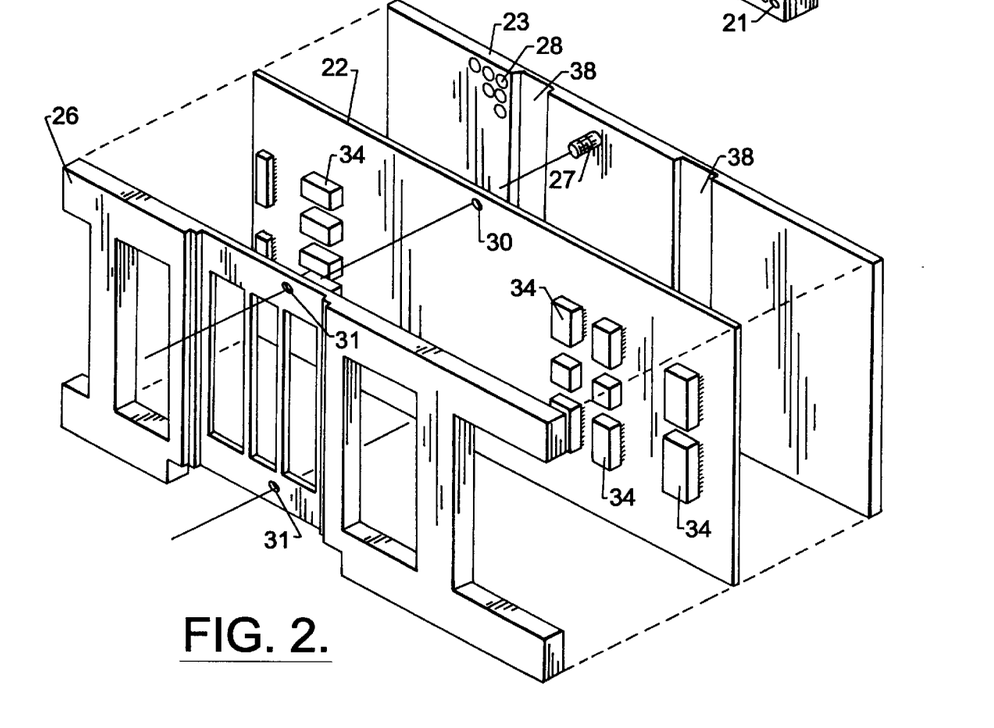
FIG. 2 is a perspective view of the rear portion of the module of FIG. 1.

FIGS. 1 and 2 are front and rear perspective views showing the module broadly designated at 20. A matrix of substantially flat full color pixels, several of which are labeled as 21 in FIG. 1 are mounted on a first surface of a printed circuit board 22. As will be set forth in more detail herein, each of the pixels 21 comprises a red LED, a green LED and a blue LED. As perhaps best illustrated in FIG. 2, the driving circuitry for the light emitting diode pixels is mounted on the opposite surface of the printed circuit board 22.

It will also be understood that a pixel could include more than one LED of one or more of the colors as might be desired for certain applications of the pixels and the modules. For the sake of brevity, however, the pixels herein will be described in terms of one red, one green, and one blue LED.

FIG. 1 further illustrates that the module 20 also comprises a front masking plate 23 on the same surface of the printed circuit board as the pixels 21. As further illustrated in the enlarged portion of FIG. 1, the front masking plate can comprise contrast enhancement means which in the illustrated embodiment comprises the dark portions 24 of the masking plate 23 and the white reflector portions 25. Whenever an individual pixel 21 is lighted, the contrast between the dark portion 24 and the white portion 25 combined with the output of the pixel can help enhance the overall image to persons viewing it.

In preferred embodiments the front masking plate 23 comprises a molded plastic panel, typically a plastic such as acrylonitrile butadiene styrene copolymer (ABS), with a matrix of holes 28 dissecting the front and back of the panel so that the holes are arranged in a matrix of the same or substantially similar position and size as the pixels 21 mounted on the printed circuit board 22. In the preferred embodiments, the walls of the holes 28 are at an angle to thereby provide a means of reflecting light emitted obliquely from the pixels 21 forward from the module and the size of the holes at the front of the display are of a sufficient diameter, relative to the pitch of the holes, to provide a suitably high density and a pleasant visual image, while leaving sufficient area surrounding each of the holes to provide a contrast ratio.

The preferred embodiment uses a ratio of hole to pixel pitch of not less than 5.5 to 7.62. As noted above, the inside surfaces 25 of the holes are either white or some similar reflective color, while the area 24 surrounding the holes is of a dark or contrasting color.

FIG. 2 shows that the display module 20 can further comprise a supporting frame 26 on the opposite surface of the printed circuit board from the pixels 21. In preferred embodiments, the front masking plate further comprises a post 27. The printed circuit board 22 comprises a clearance hole 30 that can be aligned with the post 27, and through which the post 27 extends. The supporting frame 26 includes means, shown as the holes 31, for receiving the posts 27 and into which the posts 27 are received, as well as means, such as a threaded interior (not shown) of the post 27, which when combined with a screw or bolt secures the frame 26 to the post 27. These features secure the front masking plate 23 to the supporting frame 26 with the printed circuit board 22 therebetween and thereby minimize or prevent dislocation between the printed circuit board 22 and the masking plate 23 or the frame 26, but while allowing the printed circuit board and the frame 26 to move independently enough to avoid damage in the case of thermal expansion.

As FIG. 2 illustrates, in preferred embodiments the frame 26 defines a first slot 32 adjacent the printed circuit board 22 for permitting the flow of air between the frame 26 and the printed circuit board 22 to aid in the dissipation of heat. In a further aspect of the preferred embodiment, the frame 26 also comprises a conductive mounting means opposite the printed circuit board 22 for removably clipping the module to a power source. The mounting means preferably comprises a second slot 29 opposite the printed circuit board from the pixels that can be connected to a standard power source such as a bus bar.

In preferred embodiments, the front masking plate 23 can also comprise several slots 38 for air flow, and can further comprise a conductive coating, typically a spray painted conductive coating, that is in contact with the ground signal of the driving circuitry to thereby reduce the electromagnetic emissions of the module 20.

The module 20 of the present invention also comprises driving circuitry shown as the circuit elements in FIG. 2, several of which are designated at 34. The circuit elements 34 are interconnected with the pixels 21 through the printed circuit board 22. By mounting the driving circuitry on the same printed circuit board as the pixels, the invention provides an extremely narrow profile for the module regardless of the overall size of a single module (i.e. rows and columns), and regardless of how many modules are combined to form a total display.

Figure 3:
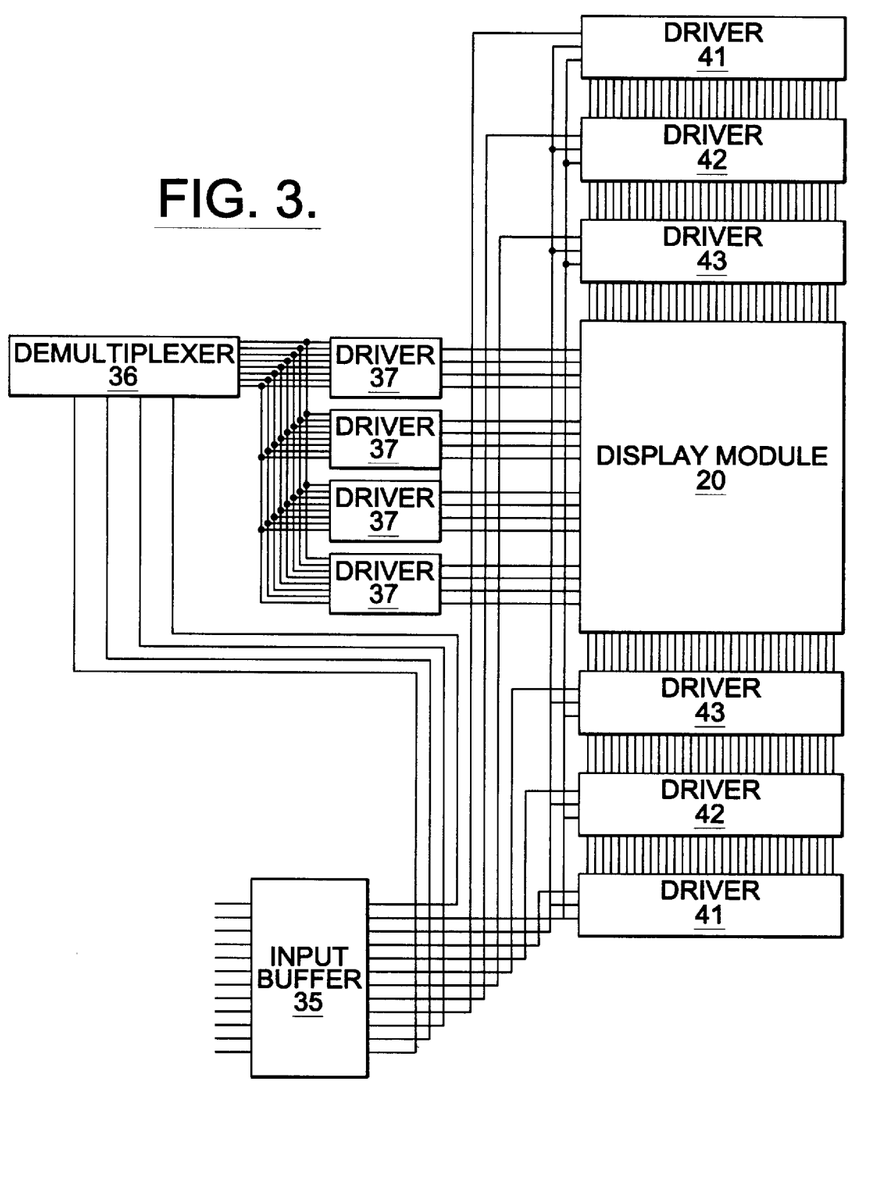
FIG. 3 is a circuit diagram illustrating a portion of the driving circuitry for the module of the present invention.

FIG. 3 illustrates some of the specified circuit elements of the present invention. Preferably the driving circuitry comprises an input buffer 35, demultiplexer 36 electrically responsive to the input buffer 35, row drivers 37 electrically responsive to the demultiplexer 36, and a column drivers designated as 41, 42 and 43 electrically responsive to the input buffer.

In preferred embodiments, the matrix comprises n rows and 2n columns where n is a power of 2 and wherein the row driver comprises four drivers each of which drive n/4 (i.e. one fourth of) of the rows. Four such drivers 37 are shown in FIG. 3. Alternatively, a single row driver capable of driving the number of rows in a group may be utilized. For example, as illustrated in FIG. 3, the matrix is divided into four sets of four row blocks. Accordingly, a single row driver having the capability of driving four rows may be utilized for all of the four row blocks. The number of blocks is determined by the number of sets of column drivers. As will be appreciated by those of skill in the art, other groupings of column drivers and row drivers may be utilized while still benefitting from the teachings of the present invention.

FIG. 3 also illustrates that in a preferred embodiment the driving circuitry includes four sets of column drivers 41, 42 and 43 each of which represents a respective 32 bit shift register, latch, and driver for the blue data 43 (i.e. data to drive the blue LEDs), the green data 42, and the red data 41. Only two of the four sets of column drivers are illustrated in FIG. 3, however, the four column drivers are identical except for the rows of the matrix from which the columns are formed and the data which is supplied to the column drivers. Thus, in the present preferred embodiment the column drivers divide the matrix into four blocks corresponding to 4 rows with 32 columns of red LEDs, 32 columns of green LEDs and 32 columns of blue LEDs. The rows of the blocks correspond to the four sets of row drivers 37.

Accordingly, the preferred embodiment is a 32×16 dot matrix LED flat panel display module which is capable of displaying approximately 16.7 million colors by combining red (660 nm), green (525 nm), and blue (430 nm) LEDs by mixing and pulse width modulation. By combining modules either horizontally, vertically, or both, virtually any size display board can be constructed. The module contains combination shift register, latch and constant current driver integrated circuits and row drive field effect transistors (FETs). The module uses a quad four row multiplexed drive method with ⅛ duty cycle for maximum brightness and minimum clock speeds.

Data is displayed on the module using multiplexing to the display. The individual pixels are arranged in a grid matrix with the common anode of the individual LEDs connected together in horizontal rows and the different color cathodes of the LEDs connected together in columns. Each row (four banks of four total) is connected to two p-type MOSFET current sources, one source being at 7.5 volts and a second source at 4.5 volts and each column (three columns per LED column for a total of 96) is connected to a constant current sink driver and an associated shift register. On start up, all row driver FETs are turned off. While the present invention is described with respect to p-type field effect transistors and positive voltages, as will be appreciated by those of skill in the art, other switching devices may be utilized as well as other voltages depending upon the characteristics of the diodes utilized and whether the diodes in a row have commonly connected anodes or cathodes.

Figure 4:
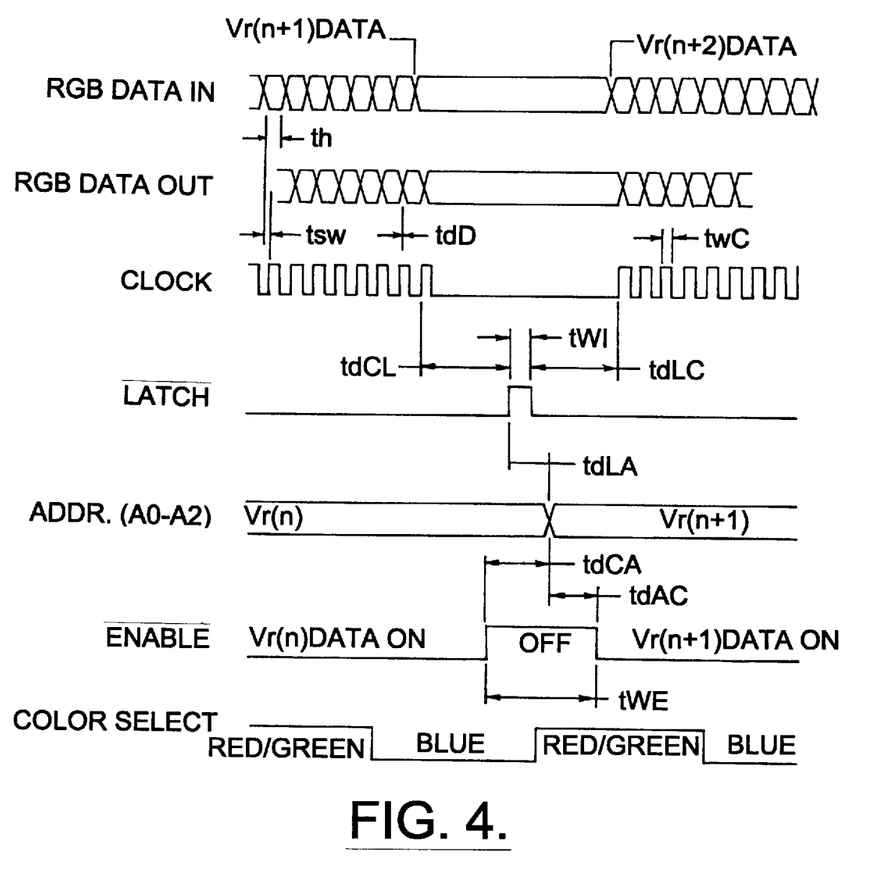
FIG. 4 is a timing diagram that illustrates the operation of the present invention.

FIG. 4 schematically illustrates the following steps that are then applied to each row consecutively commencing with the top row in a continuous repeating cycle to display a visually solid image; the number of RGB data groups (3 bits wide with a total of 12 bits for all four blocks) relating to the rows of lamps to be displayed next is clocked out into the 12 shift register banks (i.e. one bank for red, one for green and one for blue for each block corresponding to the four row drivers) on the rising edge of the clock signal. The number of data groups shifted out should be equal to the number of columns in the display, and is 32 clock cycles in the case of the preferred embodiment. Data to be displayed on the side of the modules farthest (electronically) from the input buffer is output first. The row driver FETs are then turned off by taking the complement of the "enable" signal high. The data in the shift registers is then latched into the column drivers by pulsing the "latch" signal low for no less than 25 nanoseconds (ns). The row address to the data shifted out is then placed on the A0–A1 signals (address 0 being the top row (row 0) and address 3 being the bottom row (row 3) of each block of rows). This value is normally incremented 0,1,2,3 etc. (from top to bottom for each quarter of the display). The row driver FETs are then enabled by taking the enable signal low. For each address, the "Color select" signal changes state from low to high once for each data cycle while the Enable signal is active. This "Color Select" signal switches the drivers from the first voltage to the second voltage of the LEDs such that when the Color Select selects the blue LED shift registers the drivers supply 7.5 volts to the row and when the Color Select signal selects the red and green shift registers the row drivers supply 4.5 volts to the row. This multiplexes the time per refresh cycle which the blue and the red and green LEDs are active while maintaining the overall refresh rate for the system. This assures the refresh rate of the rows will remain 1 to 8 as described in copending application Ser. No. 08/580,771. The rows of LEDs will show the image for that row. The process is then repeated for each row in a cyclical manner accessing all rows generally greater than 60 times per second and preferably about 1000 times per second to display a flicker-free multiplexed visually solid image.

Further to the preferred embodiments of the invention, each pixel 21 comprises a common anode for all three of its LEDs for turning the entire pixel on or off, and an individual cathode for each individual LED in the pixel for controlling the state and brightness of each LED, to thereby control the overall color emitted by the pixel. The level of current through the LED may be controlled by a resistor placed in series with the LED. This resistor may be variable.

Figure 5:
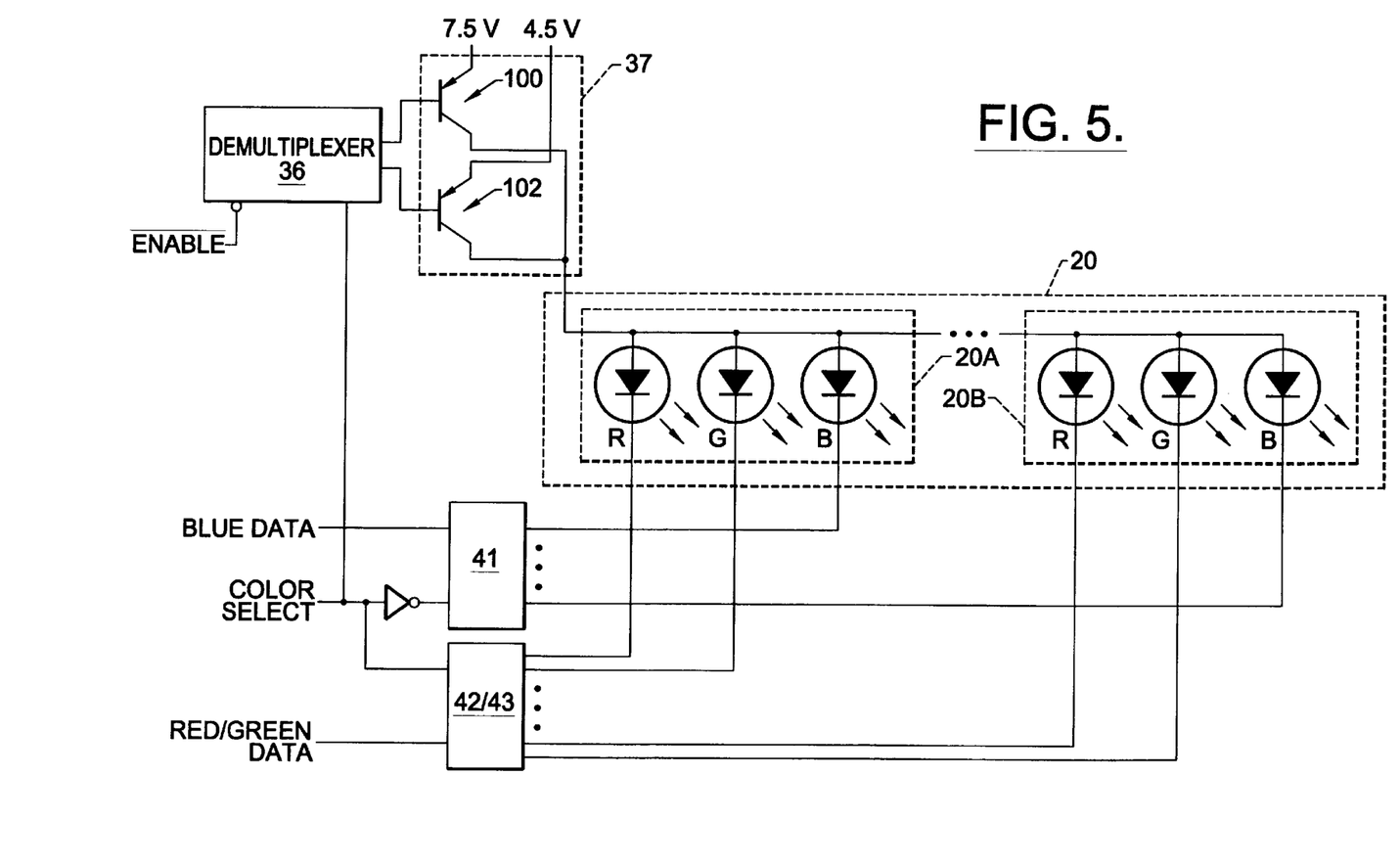
FIG. 5 is a schematic diagram of a driver circuit according to the present invention.

A further illustration of the embodiment of the present invention is illustrated in FIG. 5. As seen in FIG. 5, a portion of the matrix 20 is illustrated. This portion of the matrix 20 shows a row of LEDs, with each lamp 20A and 20B in the row having a red, green and blue LED. While two lamps are illustrated, as described above, the row may contain varying numbers of lamps. The demultiplexer 36 and two transistor drivers 100 and 102 of the row drivers 37 are illustrated. Also illustrated are the column drivers 41, 42 and 43 with drivers 42 and 43 illustrated as a single block.

As seen in FIG. 5, drive transistor 100 is connected to a 7.5 volt voltage source and drive transistor 102 is connected to a 4.5 volt voltage source. The outputs of transistors 100 and 102 are connected together and connected to the LED row of matrix 20. In operation, as described above, the shift registers of column drivers 41, 42 and 43 are loaded with data for a row of the matrix. The Enable signal then goes low to activate the row drivers. Based on the state of the Color Select signal, the demultiplexer 36 activates either transistor 100 or transistor 102. As illustrated in FIG. 5, when the Color Select signal is high such that the Red/Green column drivers 42 and 43 are enabled, the demultiplexer 36 selects transistor 102 and 4.5 volts is applied to the anodes of the diodes in the row of the matrix. When the Color Select signal goes low such that the blue drivers 41 is enabled, the demultiplexer 36 selects transistor 100 and 7.5 volts is applied to the anodes of the diodes in the row of the matrix. Thus, different voltages are applied to different color LEDs in the matrix 20. The voltages are multiplexed to the row based on the Color Select signal. This is accomplished by transistor 100 providing a first voltage to blue LEDs in the matrix of LEDs and transistor 102 providing a second voltage to red and green LEDs in the matrix of LEDs.

While the present invention has been described with respect to two voltages and with red and green LEDs grouped together, as will be appreciated by one of skill in the art, more than two voltages may be multiplexed to the LED matrix. For example, a separate voltage could be provided for each color LED in the matrix. Alternatively, a separate voltage could be provided for each group of LEDs which have common operating characteristics. Likewise, other groupings of colors of LEDs could be utilized. These alternative embodiments would need to have a driver for each voltage desired and a signal which selects the desired voltage at the appropriate time.

In addition to simply selecting between the voltage to apply to the LEDs, the duty cycle of the signal which selects the activation of the LEDs may be varied so as to illuminate different color LEDs for different times during each scan cycle. This varying duty cycle may be utilized, for example, to balance color between the LEDs.

In preferred embodiments, the invention further comprises a monostable circuit means for preventing the maximum rating of the diodes in the pixels from being exceeded. More specifically, on the rising edge of the enable signal the output goes high or stays high for a time period set by a capacitor and resistor in series. The capacitor and resistor are adjusted such that the length of time the output stays high is longer than the time between successive enable transitions. Therefore if the enable transition does not occur due to controller failure, then the output signal goes low disabling the column driver 4 and turning off the LEDs.

In preferred embodiments, the blue LED 46 comprises a silicon carbide substrate and a Group III active nitride layer, with gallium nitride being a particularly preferred active layer. Such light emitting diodes are well described in the earlier-noted incorporated patent and copending applications.

As noted above, the red LED is preferably formed of aluminum gallium arsenide.

The green LED 45 can be formed of a Group III phosphide active layer such as gallium phosphide or aluminum indium gallium phosphide, or the green LED can be formed similar to the blue LED in that it comprises a silicon carbide substrate and a gallium nitride active layer.

In embodiments in which both the blue and green LED comprise silicon carbide substrates and Group III active layers, their voltage parameters can be generally matched to one another to simplify the driving circuitry.

In preferred embodiments, the LEDs are all driven by constant current devices, these drive sources, however, selectively provide differing voltages to the LEDS to compensate for the differences between the forward voltage characteristics of the red LED, the green LED and the blue LED.

The preferred embodiment uses a version of the technique known in the art as multiplex scanning wherein each row or column in the matrix is individually illuminated in a continuous succession at a sufficiently high repetition rate to form an apparently continuous visual image. Customarily such modules utilize a multiplex ratio equal to the height of the display in rows. In the case of multiple rows of modules forming the display, the rows of each module are controlled in parallel. Such means provides a low cost method of controlling a large number of pixels as only one set of column drivers is required for a large number of rows of pixels. Such arrangements can also be constructed orthorhombically such that only one set of row drivers is required or a large number of columns of pixels.

The lamps are provided with power generally equal to the number of rows multiplied by the continuous current rating of the individual diodes. Therefore, when the individual diodes have a nominal d.c. current rating of 20 milliamps (mA) and the multiplex is sixteen, up to 320 mA of current is applied. This high current stresses the diode, however, and shortens its life. Additionally, some diode materials saturate at much lower currents. Furthermore, it is generally recognized that 100 mA is the ideal maximum current to maintain lamp life.

A further problem with multiplexing 16 rows is that 16 separate refreshes are required within the cycle time. This results in higher shift clock speeds, and leads to the use of expensive buffers, and require extensive filtering to reduce electromagnetic emissions. Accordingly, the feature of the preferred embodiment of the invention in which the rows are split into blocks of not more than four rows per block allows more brightness per pixel (i.e. 100 mA/8 versus 100 mA/16), lower clock update speeds, and less heat emitted from the column drivers. This splitting can, of course, be applied to modules having any number of rows greater than four.

Figure 7:
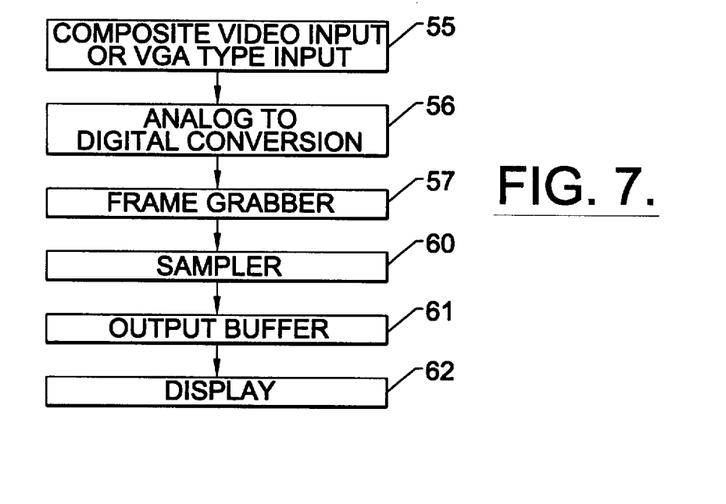
FIG. 7 is a flow diagram of one aspect of the manner in which the invention displays data.
Figure 8:
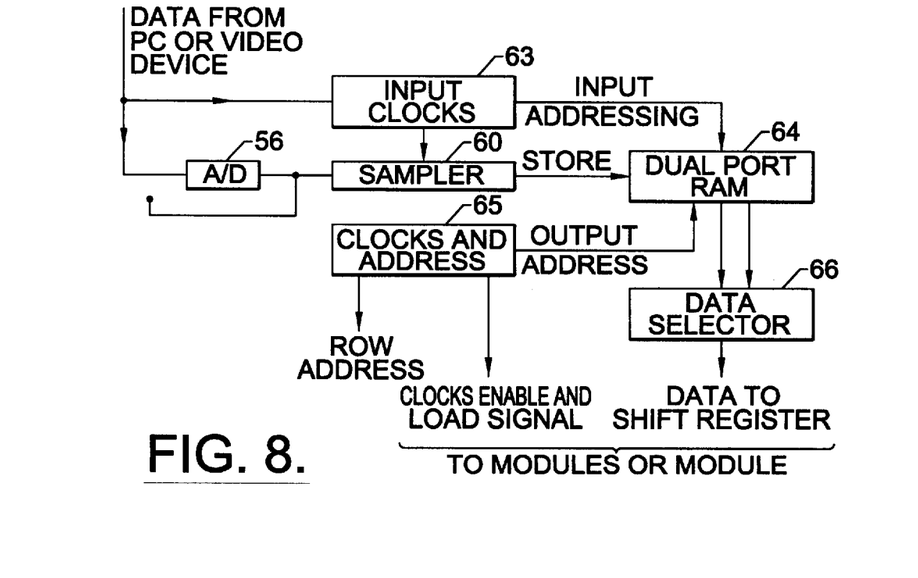
FIG. 8 is a flow diagram showing the manner in which a microprocessor controller can produce a display using a module according to the present invention.

FIGS. 7 and 8 further illustrate the operation of preferred embodiments of the invention. FIG. 7 is a flow diagram that shows that an image to be displayed can originate as a composite video input or as a VGA-type input. If it is a composition video input, the signal is converted from analog to digital by the analog to digital converter designated at 56. The input from either the converter 56 or the VGA input 55 then is sent to the frame grabber 57 then to the sampler 60. The frame grabber 57 synchronizes to the horizontal or vertical sync signals present at the beginning of each frame and line of a video signal.

After detecting the sync signal the digital data is stored in memory 64 with the sync signal providing a known reference so that the data can be stored in a repeatable and organized method.

Alternative frames are usually stored in alternative frame buffer areas 61 allowing the sampler 60 to read the previously grabbed frame while the frame grabber 57 stores the current frame. The signal then proceeds to the modules of the invention which form the display 62.

FIG. 8 illustrates how a microprocessor controller is used to run each of the modules. The data from the desired source proceeds to the input clock 63 which can send the data either to the sampler 60 or to random access memory ("RAM") 64. FIG. 8 again illustrates that where necessary a signal can be sent to an analog to digital converter 56. The data can then be sent from RAM to the clocks and the addressing system 65, or to the data selector 66. The clocks and address selectors send the signals to the rows and columns as desired, while the data selector sends it to a shift register in the modules as previously described.

Although the invention has been described with respect to individual pixels, and single modules, it will be understood that one of the particularly advantageous aspects of the invention is the capability for any number of modules to be connected with one another and driven in any appropriate manner to form large screen displays of almost any size. As is well understood to those in this art, the size of the pixels and the modules can be varied depending upon the desired point source of light. In this regard, it is well understood that a plurality of light sources of a particular size will be perceived as a single point source by an observer once that observer moves a certain distance away from those multiple sources. Accordingly, for smaller displays such as televisions, the individual pixels are maintained relatively small so that an observer can sit relatively close to the display and still perceive the picture as being formed of point sources. Alternatively, for a larger display such as outdoor displays, signage and scoreboards, the observer typically views the display at a greater distance. Thus, larger pixels, larger modules and the like can be incorporated to give brighter light while still providing the optics of point sources to the more distant observers.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed:

1. A circuit for driving a light emitting diode display having a matrix of light emitting diodes wherein the diodes are divided into at least one row having at least one diode operating with a first voltage level and at least one diode operating with a second voltage level and wherein a voltage applied to a diode operating with a first voltage level in the row is also applied to diodes in the same row operating at the second voltage level, the circuit comprising:

a first driver connected to said light emitting diodes in said row for applying said first voltage level to said light emitting diodes, wherein the first voltage level is applied to the light emitting diodes of the row of diodes when said first driver is active;

a second driver connected to said light emitting diodes in said row for applying said second voltage level to said light emitting diodes, wherein the second voltage is applied to the light emitting diodes of the row of diodes when said second driver is active;

voltage selection means connected to said first driver and said second driver for selectively activating said first driver to provide said first voltage level to said row of diodes and for selectively activating said second driver to provide said second voltage level to said row of diodes; and light emitting diode selection means connected to the diodes in said row for selectively activating said diodes when a voltage is applied to said diodes.

2. The drive circuit of claim 1 wherein said light emitting diode selection means further comprises means for selectively activating said diodes operating with a first voltage when said voltage selection means activates said first driver and for selectively activating said diodes operating with a second voltage when said voltage selection means activates said second driver.

3. The drive circuit of claim 1 further comprising multiplexing means for sequentially causing said voltage selection means to provide said first voltage and said second voltage to the diodes in the row.

4. The drive circuit of claim 1 wherein said diode selection means comprises a first shift register corresponding to said first driver and a second shift register corresponding to said second driver, said first shift register having a bit corresponding to each of said diodes in a row operating on said first voltage and said second shift register having a bit corresponding to each of said diodes in a row operating at said second voltage and wherein said diodes are activated by sequentially loading a bit pattern corresponding to the selected diodes to said shift registers.

5. The drive circuit of claim 4 wherein said first shift register is enabled when said second shift register is disabled and wherein said second shift register is enabled when said first shift register is disabled.

6. The drive circuit according to claim 5 wherein said voltage selection means selects said first voltage when said first shift register is enabled and selects said second voltage when said second shift register is enabled.

7. The drive circuit according to claim 1 wherein said light emitting diode matrix comprises a plurality of rows and wherein each of said rows has a corresponding first driver for providing a first voltage to the row and a corresponding second driver for providing a second voltage to the row.

8. The drive circuit according to claim 7, further comprising scanning means for sequentially causing for each row of said plurality of rows said voltage selection means to activate said first driver to provide said first voltage to a row and to activate said second driver to provide said second voltage to said row.

\* \* \* \* \*